United States Patent
Magnuson et al.

(10) Patent No.: US 6,630,743 B2
(45) Date of Patent: Oct. 7, 2003

(54) COPPER PLATED PTH BARRELS AND METHODS FOR FABRICATING

(75) Inventors: Roy H. Magnuson, Endicott, NY (US); Voya R. Markovich, Endwell, NY (US); Thomas R. Miller, Endwell, NY (US); Michael Wozniak, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 290 days.

(21) Appl. No.: 09/795,332

(22) Filed: Feb. 27, 2001

(65) Prior Publication Data
US 2002/0195716 A1 Dec. 26, 2002

(51) Int. Cl.[7] ............................................. H01L 23/48
(52) U.S. Cl. .................... 257/774; 257/750; 257/758; 257/762; 257/764; 257/766
(58) Field of Search ................. 257/774, 794, 257/764, 750, 758, 762, 766

(56) References Cited

U.S. PATENT DOCUMENTS

| | | | | |
|---|---|---|---|---|
| RE29,784 E | * | 9/1978 | Chadwick et al. | 174/68.5 |
| 4,339,303 A | * | 7/1982 | Frisch et al. | 156/629 |
| 4,478,883 A | | 10/1984 | Bupp et al. | 427/97 |
| 4,605,471 A | * | 8/1986 | Mitchell | 156/645 |
| 5,139,923 A | * | 8/1992 | Toba et al. | 430/313 |
| 5,309,322 A | * | 5/1994 | Wagner et al. | 361/723 |
| 5,557,844 A | * | 9/1996 | Bhatt et al. | 29/852 |
| 5,612,576 A | * | 3/1997 | Wilson et al. | 257/788 |
| 5,758,412 A | * | 6/1998 | Knopp | 29/852 |
| 5,953,594 A | | 9/1999 | Bhatt et al. | 438/125 |
| 6,438,830 B1 | * | 8/2002 | Dibble et al. | 29/876 |

FOREIGN PATENT DOCUMENTS

| | | | | |
|---|---|---|---|---|
| JP | 50-21263 | * | 3/1975 | H05K/3/00 |
| JP | 54-71371 | * | 6/1979 | H01L/21/30 |
| JP | 6-334337 | * | 12/1994 | |

* cited by examiner

Primary Examiner—Jasmine J B Clark
(74) Attorney, Agent, or Firm—Connolly Bove Lodge & Hutz, LLP; Arthur Samodovitz

(57) ABSTRACT

A circuitized semiconductor substrate comprising a layer of dielectric material having holes therethrough, a catalyst seed layer lining the walls of the holes along the surface of the dielectric material, and a nickel layer in the openings and a layer of copper above the nickel layer, along with a method for its fabrication. The invention also provides copper-nickel laminate PTH barrels and methods for their fabrication.

11 Claims, 3 Drawing Sheets

COPPER PLATED PTH BARRELS AND METHODS FOR FABRICATING

TECHNICAL FIELD

The present invention relates to circuitized printed wiring board structures and especially to via barrels having enhanced copper adhesion. The enhanced adhesiveness of the copper plating provides improved performance in high temperature assembly operations. The present invention also provides a method for fabricating via barrels plated with highly adherent copper.

BACKGROUND OF THE INVENTION

In the manufacture of printed circuit boards, sometimes known as printed wiring boards, it is now commonplace to produce printed circuitry on both sides of a planar rigid or flexible insulating substrate. Of increased importance is the manufacture of multilayer printed circuits. In these products, the board consists of parallel, planar, alternating innerlayers of insulating substrate material and conductive metal. The exposed outer sides of the laminated structure are provided with circuit patterns as with double-sided boards, and the metal innerlayers may themselves contain circuit patterns.

In double-sided and multilayer printed circuit boards, it is necessary to provide conductive interconnection between or among the various layers or sides of the board containing conductive circuitry. This is commonly achieved by providing metallized, conductive thru-holes in the board communicating with the sides and layers requiring electrical interconnection. For some applications, it is desired that electrical connection be made with up to all of the conductive layers. In such case, thru-holes are provided through the entire thickness of the board. For other applications, it is desired to provide electrical connection between the circuitry on one face of the board and one or more of the inner circuit layers. In those cases, blind via, passing only part way through the board are provided. For purposes of this application, the terms "thru-hole," "blind via," and "via" are used interchangeably.

To provide the desired circuit pattern on the board, the art has developed a variety of manufacturing sequences, many of which fall into the broad categories of "subtractive" or "additive" techniques. Common to subtractive processes is the need to etch away (or subtract) metal to expose substrate surface in areas where no circuitry is desired. Additive processes, on the other hand, begin with exposed substrate surfaces (or thin commoning metallization layers for additive electroplate) and build up thereon metallization in desired areas, the desired areas being those not masked by a previously-applied pattern of plating resist material (e.g., photoresist in positive pattern).

Typically, via holes are drilled or punched into or through the board structure at desired locations. Drilling or punching provides newly-exposed surfaces including via barrel surfaces and via peripheral entry surfaces. The dielectric substrate, comprising a top surface, a bottom surface, and at least one exposed via hole surface, consisting partly or entirely of insulating material, is then metallized, generally by utilization of electroless metal depositing techniques.

In the manufacture of circuitized printed wiring board carrier structures, a dielectric sheet material is employed as the substrate. The substrate typically is an organic material, such as fiberglass-reinforced epoxy resin (FR4), polytetrafluoroethylene, etc. Since the dielectric substrate is nonconductive, in order to plate on the substrate, the substrate must be seeded or catalyzed prior to the deposition of metal onto the substrate. The electroless plating of copper onto a substrate is well-known in the art. For instance, an electroless or autocatalytic copper plating bath usually contains a cupric salt, a reducing agent for the cupric salt, a chelating or complexing agent, and a pH adjustor. In addition, if the surface being plated is not already catalytic for the deposition of the desired metal, a suitable catalyst is deposited onto the surface prior to contact with the plating bath. Among the more widely employed procedures for catalyzing a surface is the use of stannous chloride sensitizing solution and a palladium chloride activator to form a layer of metallic palladium particles.

Copper is not highly adherent to the materials typically used as the dielectric substrate. The deposited copper is generally anchored to the exposed inner copper layers more than the dielectric. During subsequent process steps, especially thermal cycling, the copper "barrel" has a tendency to crack or delaminate, causing open circuits. Therefore a requirement exists for means to increase the bonding strength of the copper to the substrate.

The present invention provides the desired increased durability of via barrels without the requirement for many of the additional processing steps and materials used in prior art solutions. For example, Takahashi et al. (U.S. Pat. No. 5,309,632) require a double resist process and the application of an adhesive layer to the entire board surface. Their method also plates nickel over the entire board surface and then strip the nickel in excess of the circuitization.

It is known in the prior art to provide a layer of nickel over substantially the entire surface of the wiring board, print copper circuitization over the nickel, and then to strip excess nickel. Examples of this practice include Cane (U.S. Pat. No. 5,648,125). Stripping of Ni after application of Cu results in a line substantially trapezoidal in cross-section, with portions of the Cu wiring cantilevered, unstably over the Ni. In addition to plating Ni only where circuitization is to be invoked, the process of the present invention results in lines of substantially rectangular cross-section and thus a more stable bonding of the Cu.

Another disadvantage of prior art methods is exemplified by Knopp (U.S. Pat. No. 5,758,412) where the thickness of the underplated metal is too thin to provide circuitization robustness against subsequent high temperature assembly steps.

SUMMARY OF INVENTION

The present invention provides via barrels exhibiting high copper to substrate adhesion. The present invention makes possible via barrels that survive the thermal stresses of high temperature assembly and have a longer thermal cycle life than bare copper barrels.

More specifically, the present invention provides via barrels which comprise: a wiring board of dielectric material wherein a plurality of via are defined; a catalyst seed layer located on the inner surface of the via within the dielectric material; a layer of nickel deposited on top of the catalyst seed layer; and a layer of copper plating in the openings and over the layer of nickel.

It is an aspect of the invention to provide more robust metallization of via barrels by providing multiple metallization layers.

It is an aspect of the invention to provide more robust metallization of via barrels by providing metallization of via barrel surfaces including via peripheral entry surfaces, and providing metallization of via surfaces continuous with metallization of the top and bottom surfaces and the conductive layers of the dielectric substrate.

It is an aspect of the invention to provide more robust metallization of via barrels by providing a circuitized printed wiring board comprising a dielectric substrate having a top surface, and a bottom surface, and at least one via, the at least one via having a via barrel surface and at least one via peripheral entry surface; a first metallization layer deposited on the via barrel surface and the at least one via peripheral entry surface of the at least one via, the top surface, and the bottom surface of the dielectric substrate; a second metallization layer deposited on the first metallization layer on the via barrel surface and the at least one via peripheral entry surface of the at least one via, and selectively deposited on the first metallization layer on the top surface and the bottom surface of said dielectric substrate; and a third metallization layer deposited on the second metallization layer on the first metallization layer on the via barrel surface and the at least one via peripheral entry surface of the at least one via, and selectively deposited on the second metallization layer on the first metallization layer on the top surface and the bottom surface of the dielectric substrate.

The present invention also relates to fabricating the above disclosed printed circuit board. The method comprises: providing a board having a top surface and a bottom surface and comprised of one or more layers of dielectric material and optionally one or more inner conductive layers which are optionally personalized by provision of a pattern such as a circuit pattern; depositing a catalyst seed layer on the layer of dielectric material; depositing a layer of nickel on top of the catalyst seed layer; and depositing a layer of copper plating over the layer of nickel.

Metallization of the dielectric substrate comprises providing a first metallization layer termed a catalytic seed layer and is typically palladium and tin; providing a second metallization layer wherein the layer is chosen from the group VIII and Group IB transition metals and is typically nickel; and providing a third metallization layer, typically copper. Alternatively, the catalytic seed layer is thus termed and the nickel and copper layers are respectively termed the "first metallization" and the "second metallization."

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

SUMMARY OF DRAWINGS

The invention is best understood from the following detailed description when read in connection with the accompanying drawings. It is emphasized that, according to common practice, the various features of the drawing are not to scale. On the contrary, the dimensions of the various features are arbitrarily expanded or reduced for clarity.

BEST AND VARIOUS MODES FOR CARRYING OUT INVENTION

Reference is made to the figures to illustrate selected embodiments and preferred modes of carrying out the invention. It is to be understood that the invention is not hereby limited to those aspects depicted in the figures.

Figure 1:
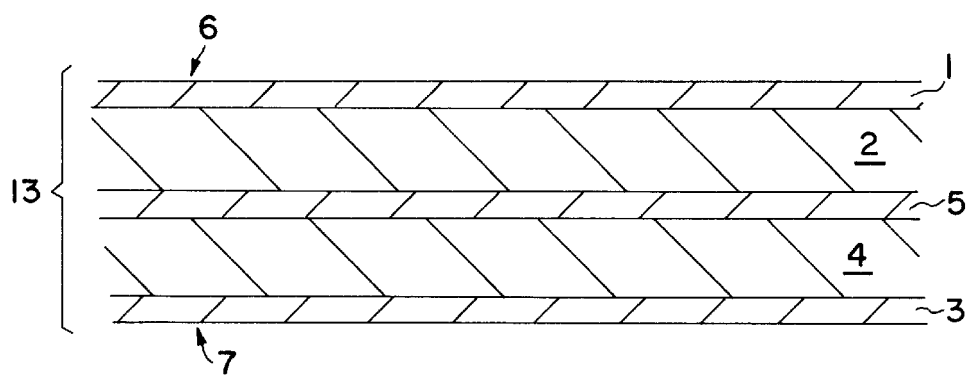
FIG. 1 is a schematic cross-section of base member.

In FIG. 1, there is shown an electrically insulative base member 13 which may be used in the present invention to produce a printed wiring board (described below). It is understood that the invention is not limited to the particular configuration shown in FIG. 1, as others are readily possible. Base member 13 includes first and second conductive layers 1 and 3, which sandwich there between, first and second dielectric layers 2 and 4 and conductive plane 5. In a preferred embodiment, each of the two conductive layers is comprised of copper or a well-known conductive material, each having a thickness from about 0.25 mils (0.0025 inches) to about 1.5 mils with the thickness of each preferably being about 0.25 mils. Preferably each of the two dielectric layers is comprised of fiberglass reinforced epoxy resin (FR4).

A typical FR-4 epoxy composition contains 70–90 parts of brominated polyglycidyl ether of bisphenol-A and 10–30 parts of tetrakis (hydroxyphenyl) ethane tetraglycidyl ether cured with 3 to 4 parts of dicyandiamide, and 0.2 to 0.4 parts of a tertiary amine, all parts being parts by weight per 100 parts of resin solids.

Another typical FR-4 epoxy composition contains: a) about 25 to about 30 parts by weight of a tetrabrominated diglycidyl ether of bisphenol-A having an epoxy equivalent weight of about 350 to about 450; b) about 10 to about 15 parts by weight of a tetrabrominated diglycidyl ether of bisphenol-A having an epoxy equivalent weight of about 600 to about 750; and c) about 55 to about 65 parts by weight of at least one epoxidized non-linear novolak, having at least terminal epoxy groups, along with suitable curing and/or hardening agents.

Another typical FR-4 epoxy composition contains about 70 to about 90 parts of brominated polyglycidyl ether of bisphenol-A, and 10 to 30 parts of tetrakis (hydroxyphenyl) ethane tetraglycidyl ether cured with 0.8 to 1 part of 2-methyl imidazole.

Still another FR-4 epoxy composition employs tetrabromo bisphenol-A as the curing agent, along with 2-methyl imidazole as the catalyst.

In alternative embodiments, a wide variety of dielectric (non-conductive) substrates can be employed and, as described in the prior art, include thermoplastic and thermosetting resins. Typical thermosetting polymeric materials include epoxy, phenolic based materials, and polyamides. The dielectric materials may be molded articles of the polymers containing fillers and/or reinforcing agents, such as glass-filled epoxy or phenolic based materials. Examples of some phenolic type materials include copolymers of phenol, resorcinol and cresol. Examples of some suitable thermoplastic polymeric materials include polyolefins, such as polypropylene, polysulfones, polycarbonates, nitrile rubbers, ABS polymers and fluorinated polymeric materials such as polytetrafluoroethylene.

In preferred embodiments, comprising FR4, each dielectric layer possesses a thickness of from about 2 mils to about 20 mils. Thicknesses less than about 2 mils for this particular material may be undesirable because the resulting structure may be flimsy and difficult to handle during subsequent manufacturing processes. Thicknesses greater than about 20 mils may be undesirable because such thick dielectric layers, in addition to requiring relatively large conductor line widths and thicknesses, also may prevent optimum package electrical performance.

Sandwiched between dielectric layers 2 and 4 is conductive plane 5, preferably of copper or other well-known conductive material and possessing a thickness of preferably within the range of about 0.125 mils to about 2.5 mils. The thicknesses for plane 5 of less than about 0.125 mils may prove undesirable should the resulting structure by subjected to relatively high temperatures. Additionally, thicknesses greater than about 2.5 mils may prove undesirable because of the additional time necessary to form such layers using conventional plating techniques and associated difficulties with line width control.

The resulting structure shown in FIG. 1 thus preferably possesses a thickness within the range of about 4.7 mils to about 400 mils. The preferred thickness is governed by the desired number of signal planes.

Conductive layers 1 and 3 and dielectric layers 2 and 4 are bonded to the conductive plane 5 using a lamination process, such a process known in the art and further description is not believed necessary.

Base member 13 is thus shown to include at least two surfaces, a first surface 6, and a second surface 7.

Although two conductive layers and two dielectric layers are shown for base member 13, it is understood that the invention is not limited thereto. Specifically, it is only necessary to provide one such conductive layer and one such dielectric layer while still attaining the advantageous results taught herein. At least two layers of each are used when it is desired to incorporate an internal conductive plane (e.g., power, ground or signal) as part of the final structure. Understandably, several dielectric layers and corresponding internal conductive planes may be utilized, depending on operational requirements for the finished product.

Figure 2:
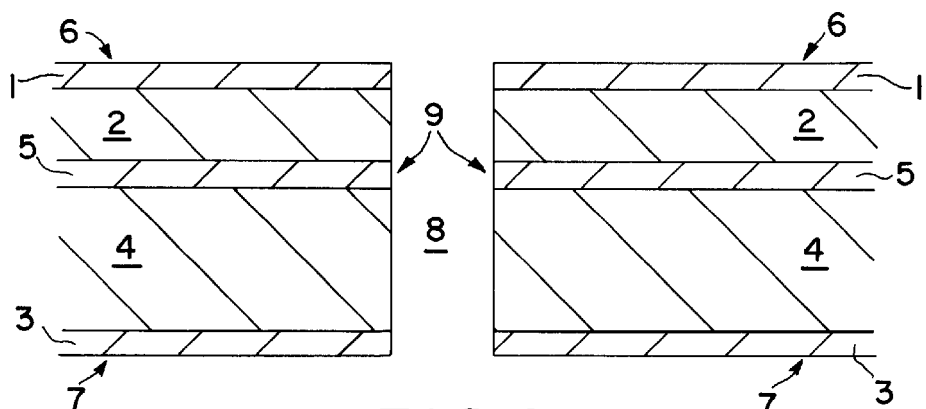
FIG. 2 is a schematic transverse section of base member following formation of through hole.

In FIG. 2, opening 8 having an internal wall surface or via barrel surface 9 and having a via peripheral entry surface or knee 9A is formed substantially through base member 13. Although only one opening is shown formed in base member 13, it is understood that multiple openings may be formed in base member 13 depending on the ultimate electrical requirements of the circuitized substrate. Opening 8, which may be any type of via, may be formed by mechanical drilling although other hole forming techniques such as punching and laser drilling can be used. The minimum diameter of opening 8 is governed by the depth of the hole such that an approximately unitary aspect ratio (hole diameter/depth) is achieved. The upper limit of hole diameter is a function of the purpose of the hole.

In the next step, it is preferred to provide a first metallization layer 10 on the surfaces 6 and 7 of base member 13, and on internal wall 9 of opening 8 to act as a catalyst for future metallization layers.

Figure 3:
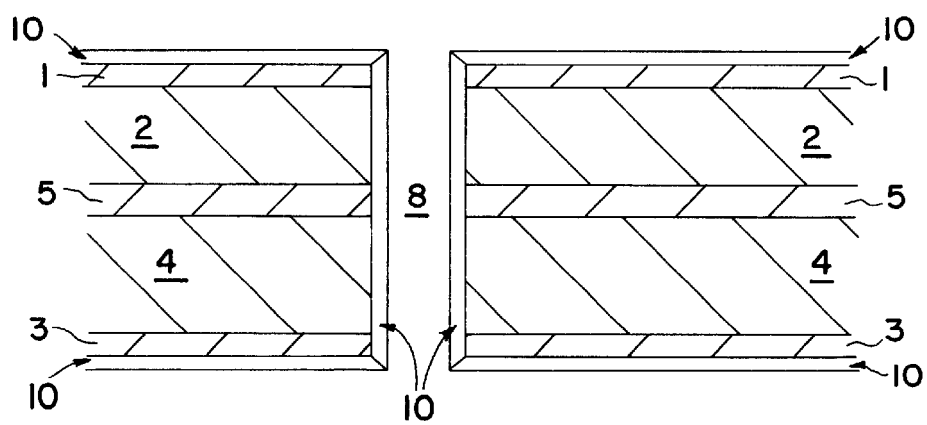
FIG. 3 is a schematic cross-section of base member after contact with catalytic composition.

FIG. 3 shows base member 13 after contact with a composition containing a catalytic composition capable of initiating an electroless plating process providing a catalyst seed layer 10. The catalyst seed layer 10 is alternatively referred to as the first metallization layer. The compositions contain a metal that can directly provide the catalytic sites, or serve as a precursor which leads to the catalytic sites. The metal present may be in the elemental form, an alloy, or compound, or mixtures thereof. The preferred metal catalysts are precious metals, such as gold, palladium, and platinum. A typical palladium composition contains about 1.2 to about 2.5 grams per liter of a palladium salt, which is preferably $PdCl_2$, about 80 to about 150 grams per liter of a stannous salt, which is preferably $SnCl_2.2H_2O$, and about 100 to about 150 milliliters per liter of an acid which is preferably HCl. When HCl is provided in the form of a 37% HCl solution, about 280 to about 360 milliliters of the HCl solution is preferably employed. The most preferred composition contains about 1.5 grams per liter of $PdCl_2$ and about 280 milliliters per liter of 37% HCl. The composition is usually maintained at a temperature of about 65±10° F. A typical triple-seeder process is disclosed, for instance, in Alpaugh et al U.S. Pat. No. 4,525,390, disclosure of which is incorporated herein by reference.

Subsequently, the substrate can be treated with an acid or alkaline accelerator such as a 2% NaOH solution to remove excess tin which is typically deposited along with the Pd catalyst. This step usually takes about 1 to about 5 minutes and, more typically, about 1 to about 2 minutes.

The substrates can then be dried, such as by being vacuum dried in an oven for 30 minutes at a temperature of about 100° C. In the drying operation, all the water is driven off irreversibly from the colloidal particles, leaving a shell of oxygen in the form of insoluble tin oxide.

Moreover, if desired, prior to providing the catalyst seed layer 10, the dielectric layers 2 and 4 can be treated with an acidic solution containing a multifunctional ionic copolymer containing at least two available cationic functional moieties. The preferred ionic moieties are quaternary phosphonium and quaternary ammonium groups. Copolymers containing at least two cationic moieties such as, for example, copolymers of polyacrylamide forming the inert backbone and functionally active tetraalkylammonium compounds, are commercially available and need not be described herein in detail. Multifunctional cationic copolymers of that type are Reten 210 and Reten 220, available from HERCULES, description of which can be found in "Water-Soluble Polymers", Bulletin VC-482A, HERCULES, Inc., Wilmington, Del., 1989, disclosure of which is incorporated herein by reference.

Reten 210 is in powder form and is a copolymer of acrylamide and beta-methacryloxyethyltrimethylammonium methyl sulfate, of which a 1% solution has a Brookfield viscosity of 600–1000 cps. Reten 220 is also in powder form and consists of the same monomers as Reten 210, but its 1% solution has a Brookfield viscosity of 800–1200 cps. The molecular weights of the Reten polymers are usually relatively high and vary from about 50,000 to about 1,000,000 or more. The quaternary ammonium groups provide the number of positive charges of the polymer.

In the various aspects of the present invention, the ionic copolymer is employed as a dilute acidic solution of about 0.01% to about 1% by weight, and preferably about 0.05% to about 0.5% by weight of the copolymer. The acid contained in the solution is preferably $H_2SO_4$, and the pH value of the solution is between 0 and about 3. The use of a low pH value is preferred to obtain a relatively low viscosity of the copolymer solution to facilitate application of the polymer. The treatment with the ionic copolymer is generally about 1 minute to about 10 minutes, and preferably about 1 minute to about 2 minutes, and takes place at about room temperature.

The multifunctional copolymer, having a very good adhesion to the substrate surface, provides the surface with a charge opposite from that associated with the seed particles 10 applied to the substrate. This difference in polarity provides for electrostatic attraction of the seed particles. After the substrate is brought into contact with the ionic copolymer composition, the substrate is rinsed to remove any excess polymer not adhering to the substrate surface.

Figure 4:
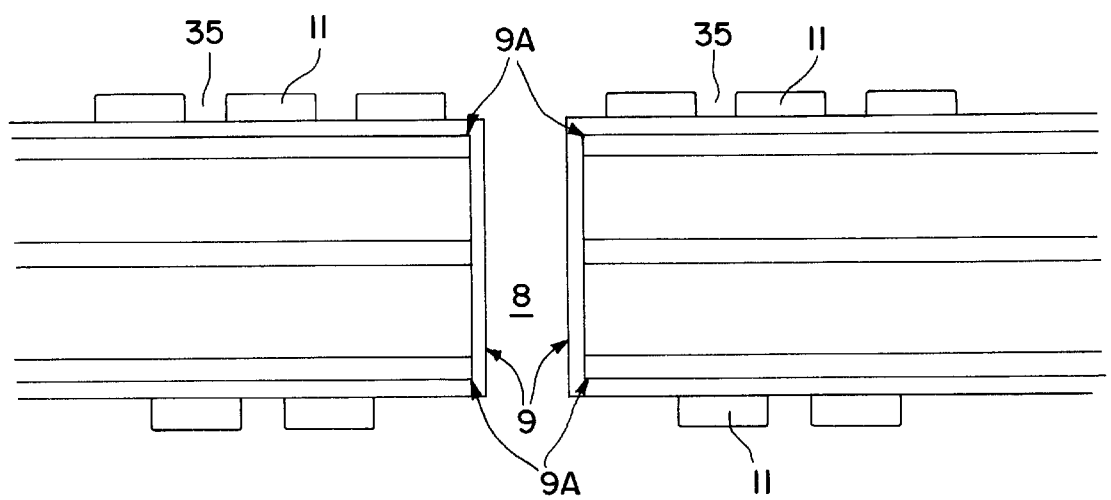
FIG. 4 is a schematic cross-section of base member after application of photoresist.

A layer 31 of photoimaging (photoresist) material is then applied to the surfaces of member 13 over the first metallization layer. In one example, the layer of photoresist possessed a thickness of from about 0.3 mils to about 2.0 mils. A preferred material is a positive-acting photoresist, various examples being known in the art, including T168 photoresist available from the E. I. du Pont de Nemours Corporation under this trade designation. A positive-acting photoresists, when applied and exposed through a suitable photomask, undergo a physical and chemical change in the exposed areas that render these areas insoluble to the subsequent developing solution which is to be applied thereto. Following exposure, the resist-coated base member 13 is immersed in developing solution (e.g., benzyl alcohol or propylene carbonate), which allows the unexposed areas to be removed without excessive impact on the hardened, exposed area. Baking or other processes may be used to further harden the remaining, exposed portions, if desired. With positive-acting photoresists, the portions developed away form the openings to the catalyzed laminated surface for subsequent plating In FIG. 4, base member 13 is shown following the above exposure and removal (developing) operations. As such, only portions of photoresist layer 31 remain. These portions are represented by the numeral 11. It is understood that the removed portions of the photoresist in turn result in openings 35 which, in turn, expose preselected areas on the respective surfaces on which circuitization is to eventually occur. Thus a predetermined pattern on both surfaces is provided. Furthermore, it is understood that the photomask is designed such that the internal wall 9 of through holes 8 are not exposed.

Figure 5:
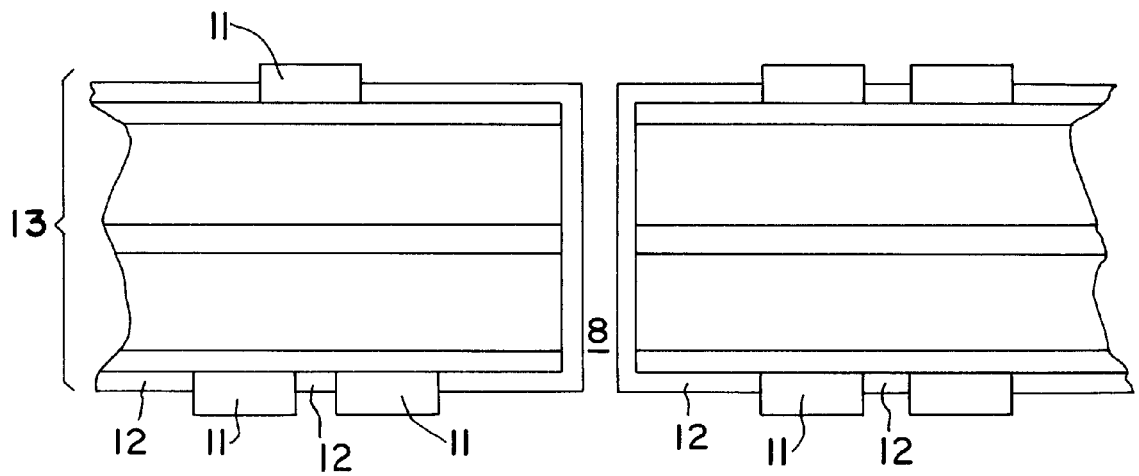
FIG. 5 is a schematic cross-section of base member after second metallization layer.

As seen next, in FIG. 5, a second metallization layer 12 is deposited into the photoresist openings formed on base member 13 and in through hole 8. The second metallization conductive layer 12 comprises nickel. The thickness of this second metallization conductive layer may be from about 0.1 mils to about 0.15 mils preferably about 0.12 mils to about 0.13 mils. The nickel is deposited on the seed layer by immersing into an electroless nickel plating process as known in the industry. Plating chemistries for electroless nickel plating are well known in the industry and need not be described herein in any detail.

Typical methods for depositing nickel on the surface or surfaces of a substrate involve immersing the substrate in an aqueous solution comprising as ingredients a source of nickel ions, a soluble reducing agent for the nickel, a metal complexing agent and pH adjusting agents under conditions effective to bring about electroless deposition of nickel on the surface or surfaces by means of chemical reduction.

Where the invention is practiced in conjunction with imaging printing of copper lines (see co-pending application Ser. No. 09/357,574, assigned to assignee of present invention), it is important according to the present invention that the nickel plating be carried out after the development of the layer of photoimageable material since it eliminates the possibility of electrical leakage between lines. If plated before the layer of photoimageable material, the presence of nickel beneath the layer of photoimageable material could result in electrical leakage between lines, especially when spaced relatively close to each other. In addition, the nickel bath is generally more active than a copper plating bath. Accordingly, circuitization yields are higher because the line will have fewer defects.

The second metallization layer is deposited by conventional plating methods for electroless plating. These processes typically have their own in-line seeding means because typically it is desired to plate nickel only on another metal surface. Crucial to the present invention is that the typical precleaning/preconditioning steps normally associated with this electroless nickel process are not performed. These processes remove portions of the first metallization (seed) layer. The present invention achieves the plating of nickel directly on the laminate surface. Use of precleaning or preconditioning steps removes portions of the seed particles thus causing skip plating on the laminate. Where the metal adheres to only portions of the inner surface of the hole, the adhesion is poor resulting is shortened mean time between failure.

Figure 6:
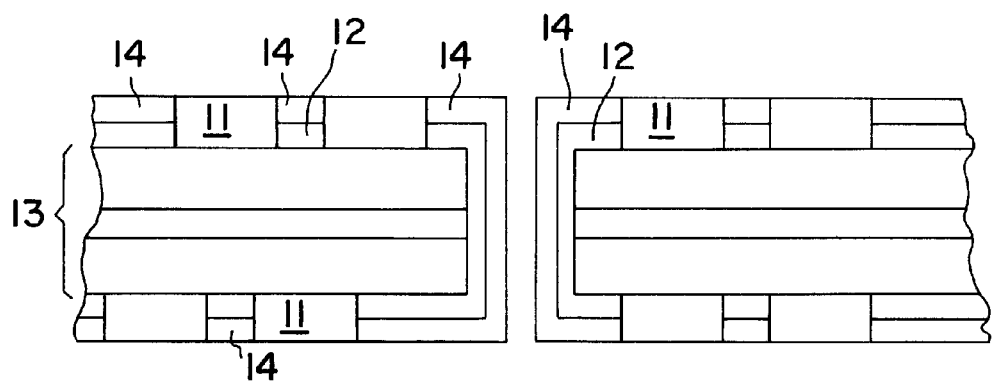
FIG. 6 is a schematic cross-section of base member after third metallization layer.

As seen in next FIG. 6, a third metallization layer 14 is deposited on the second metallization layer 12. This metallization layer is typically plated to the same height as the top of the photoresist, although not always. Generally, the photoresist thickness is matched to the final desired conductor thickness. This aids post plating processing, if needed, for planarizing to remove plated nodules or extraneous plating above the desired conductor height should it occur.

Typically, application of the third metallization layer follows substantially immediately after application of the second metallization layer. Alternatively, where it is desired to temporarily store the partial assembly, obtained through the second metallization step, it is necessary to clean the oxide or other inappropriate material coating the nickel prior to application of the third metallization layer. This cleaning may be accomplished with industry standard techniques.

It has been found that nickel, comprising the second metallization layer provides for enhanced adhesion of the copper to the substrate. Copper 14 is plated on the inner surfaces of the holes over the nickel layer 12 from an electroless plating bath to provide the desired PTH barrel thickness. Examples of suitable electroless copper plating baths can be found in U.S. Pat. Nos. 5,509,557, 4,707,377 and 4,904,506, disclosures of which are incorporated herein by reference.

The copper electroless plating bath employed is generally an aqueous composition, which contains a source of cupric ion, a complexing agent for the cupric ion, and a pH adjustor, in addition to the cyanide ion source and oxygen. In addition, the plating bath also preferably includes a surface-active agent. The cupric ion source generally used is a cupric sulfate or a cupric salt of the complexing agent to be employed. The cupric ion source in the electroless plating bath is typically employed in amounts of about 9 to about 14, and more typically about 10 to about 12 grams per liter, calculated as $CuSo_4.5H_2O$.

The most common reducing agent employed is formaldehyde. Examples of some other reducing agents include formaldehyde precursors or formaldehyde homopolymers, such as paraformaldehyde, trioxane, and gloxal; borohydrides such as alkali metal borohydrides (sodium and potassium borohydrides) and substituted borohydrides such as sodium trimethoxy borohydride; boranes such as amine borane (isopropyl amine borane and morpholine borane); and hypophosphite reducing agents. The reducing agent is generally present in amounts from about 1 to about 4 milliliters per liter, and more typically from about 2 to about 2.5 milliliters per liter.

Examples of some suitable complexing agents include Rochelle salts, ethylene diamine tetraacetic acid, the sodium (mono-, di-, tri-, and tetra-sodium) salts of ethylene diamine tetraacetic acid, nitrilo tetraacetic acid and its alkali salts, gluconic acid, gluconates, triethanol amine, glucono (gamma)-lactone, modified ethylene diamine acetates such as N-hydroxy ethyl ethylene diamine triacetate. In addition, a number of other suitable cupric complexing agents are suggested in U.S. Pat. Nos. 2,996,408; 3,075,856; 3,076,855 and 2,938,805. The preferred complexing agents are ethylene diamine tetraacetic acid and the alkali metal salts thereof. The amount of complexing agent employed is typically about 25 to about 50 grams per liter.

The plating bath can also include a surfactant which assists in wetting the surface to be coated. A satisfactory surfactant is, for instance, an organic phosphate ester, available under the trade designation "Gafac RE-610". Generally, the surfactant, if present, is used in amounts from about 0.01 to about 0.3 grams per liter.

In addition, the pH of the bath is generally controlled, for instance, by the addition of a basic compound, such as sodium hydroxide or potassium hydroxide in the desired amount to achieve the desired pH. The typical pH of the copper electroless plating bath is between 11.5 and 12.0, and more typically between 11.7 and 11.9. In addition, the plating bath can include other minor additives as is known in the art.

The typical plating baths employed have a specific gravity within the range of 1.06 to 1.08. Moreover, the temperature of the bath is typically maintained between about 70° C. and 80° C., more typically between about 70° C. and 76° C., and preferably about 72° C. to about 75° C.

The copper electroless plating bath typically contains about 5 to about 11 ppm, and more typically about 5 to about 8 ppm of cyanide ions. Examples of some cyanides are the alkali metal, alkaline earth metal, and ammonium cyanides, with sodium cyanide being a more typical example.

The electroless plating bath typically has an oxygen content of not lower than 1.5 ppm below saturation, and more typically an oxygen content of not lower than 1.0 ppm below saturation.

Plating from the copper electroless plating bath generally continues from about 8 to about 20 hours, or until the desired thickness of copper film is achieved, which is typically about 350 micro inches to about 1850 micro inches. Where desired, any copper plating either major surface may be planarized by any standard technique including chemical mechanical planarization (CMP).

Significantly, it can be seen that the plated through via will provide, after removal of the photoresist, a complete and uninterrupted conductive layer around through hole 8.

Figure 7:
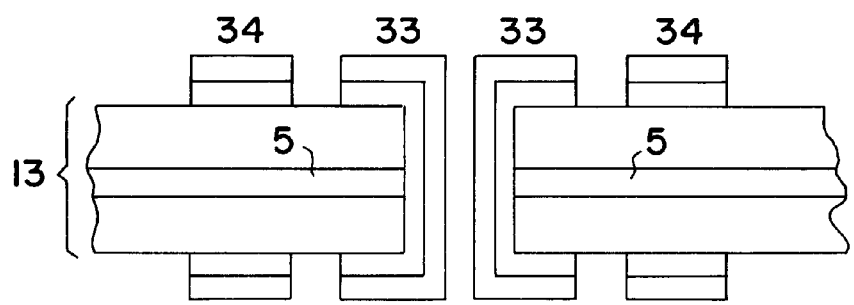
FIG. 7 is a schematic cross-section of base member following resist stripping.

In FIG. 7, the remaining portions of the photoresist layer are removed, preferably by stripping the photoresist with a suitable solvent known in the art such as propylene carbonate, sodium carbonate, benzyl alcohol, or sodium hydroxide. Other removal techniques such as laser ablation and mechanical removal or combinations thereof, may also be employed to remove the photoresist layer. In one example, the exposed areas of the first electrically conductive layer on the surfaces of base member 13 serve as one or more contact pad areas 34. In addition to the exposed contact pad areas, it is also possible to expose one or more areas 33 on base member 13, depending on operational requirements for the final product. Area 33 is a land segment which in turn surrounds through hole 8 and may serve to interconnect upper and lower layers of circuitry and also internal conductive planes such as 5, if desired.

It will, therefore, be appreciated by those skilled in the art having the benefit of this disclosure that this invention is capable of producing printed wiring boards having highly reliable plated through holes. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A circuitized printed wiring board comprising:

a dielectric substrate provided with a pattern of vias;

a catalyst seed layer as a first metallization layer located on the inner surface of said pattern of vias;

a layer of Ni deposited on said first layer; and a layer of Cu plated on said Ni layer.

2. The circuitized printed wiring board of claim 1 wherein said dielectric substrate comprises epoxy resin optionally reinforced.

3. The circuitized printed wiring board of claim 1 wherein said first metallization layer is deposited from a palladium/tin colloidal suspension.

4. The circuitized printed wiring board of claim 1 wherein the layer of nickel is about 1 to about 5 microns thick.

5. The printed wiring board of claim 1 wherein the layer of nickel is about 2.5 to about 3.5 microns thick.

6. The printed wiring board of claim 1 wherein the layer of dielectric material has a roughened surface.

7. A circuitized printed wiring board comprising:

a dielectric substrate having a top surface, and a bottom surface, and at least one via, said at least one via having a via barrel surface and at least one via peripheral entry surface;

a catalyst seed layer as a first metallization layer deposited on said via barrel surface and said at least one via peripheral entry surface of said at least one via, said top surface, and said bottom surface of said dielectric substrate;

a second metallization layer deposited on said first metallization layer on said via barrel surface and said at least one via peripheral entry surface of said at least one via, and selectively deposited on said first metallization layer on said top surface and said bottom surface of said dielectric substrate; and a third metallization layer deposited on said second metallization layer on said first metallization layer on said via barrel surface and said at least one via peripheral entry surface of said at least one via, and selectively deposited on said second metallization layer on said first metallization layer on said top surface and said bottom surface of said dielectric substrate.

8. The circuitized printed wiring board of claim 7, wherein said first metallization layer is a catalytic seed layer.

9. The circuitized printed wiring board of claim 8, wherein said catalytic seed layer is chosen from the group consisting of palladium and tin.

10. The circuitized printed wiring board of claim 8, wherein said second metallization layer is chosen from the group consisting of Group VIII and Group IB transition metals.

11. The circuitized printed wiring board of claim 8, wherein said third metallization layer is chosen from the group consisting of manganese, iron, cobalt, nickel, copper, palladium, platinum, silver, and gold.

\* \* \* \* \*